US011670381B2

(12) United States Patent
Malshe et al.

(10) Patent No.: US 11,670,381 B2
(45) Date of Patent: *Jun. 6, 2023

(54) READ VOLTAGE CALIBRATION BASED ON HOST IO OPERATIONS

(71) Applicant: Micron Technology, Inc., Boise, ID (US)

(72) Inventors: Ashutosh Malshe, Fremont, CA (US); Kishore Kumar Muchherla, Fremont, CA (US); Harish Reddy Singidi, Fremont, CA (US); Peter Sean Feeley, Boise, ID (US); Sampath Ratnam, San Jose, CA (US); Kulachet Tanpairoj, Santa Clara, CA (US); Ting Luo, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 85 days.

This patent is subject to a terminal disclaimer.

(21) Appl. No.: 17/313,249

(22) Filed: May 6, 2021

(65) Prior Publication Data

US 2021/0257031 A1    Aug. 19, 2021

Related U.S. Application Data

(60) Continuation of application No. 17/017,291, filed on Sep. 10, 2020, now Pat. No. 11,043,278, which is a (Continued)

(51) Int. Cl.
*G11C 7/00* (2006.01)
*G11C 16/26* (2006.01)
(Continued)

(52) U.S. Cl.
CPC .............. *G11C 16/26* (2013.01); *G11C 16/04* (2013.01); *G11C 16/0483* (2013.01);
(Continued)

(58) Field of Classification Search
CPC ..... G11C 16/26; G11C 16/04; G11C 16/0483; G11C 16/28; G11C 16/349; G11C 29/021;
(Continued)

(56) References Cited

U.S. PATENT DOCUMENTS 7,639,532 B2   12/2009   Roohparvar et al.
9,236,147 B1    1/2016   Bellorado et al.
(Continued)

FOREIGN PATENT DOCUMENTS

CN    111801739 A      10/2020
KR    20160062298 A     6/2016
(Continued)

OTHER PUBLICATIONS

"Korean Application Serial No. 10-2020-7009015, Final Office Action dated Sep. 27, 2021", w English translation, 8 pgs.
(Continued)

*Primary Examiner* — Hien N Nguyen
(74) *Attorney, Agent, or Firm* — Schwegman Lundberg & Woessner, P.A.

(57) ABSTRACT

Devices and techniques for read voltage calibration of a flash-based storage system based on host IO operations are disclosed. In an example, a memory device includes a NAND memory array having groups of multiple blocks of memory cells, and a memory controller to optimize voltage calibration for reads of the memory array. In an example, the optimization technique includes monitoring read operations occurring to a respective block, identifying a condition to trigger a read level calibration based on the read operations, and performing the read level calibration for the respective block or a memory component that includes the respective block. In a further example, the calibration is performed based on a threshold voltage to read the respective block, (Continued)

which may be considered when the threshold voltage to read the respective block is evaluated within a sampling operation performed by the read level calibration.

24 Claims, 8 Drawing Sheets

Related U.S. Application Data continuation of application No. 16/782,720, filed on Feb. 5, 2020, now Pat. No. 10,777,284, which is a division of application No. 16/436,567, filed on Jun. 10, 2019, now Pat. No. 10,586,602, which is a division of application No. 15/689,747, filed on Aug. 29, 2017, now Pat. No. 10,347,344.

(51) Int. Cl.
| | |
|---|---|
| *G11C 16/04* | (2006.01) |
| *G11C 16/28* | (2006.01) |
| *G11C 16/34* | (2006.01) |
| *G11C 29/02* | (2006.01) |
| *G11C 16/24* | (2006.01) |
| *G11C 16/08* | (2006.01) |

(52) U.S. Cl.
CPC ............ *G11C 16/28* (2013.01); *G11C 16/349* (2013.01); *G11C 29/021* (2013.01); *G11C 29/028* (2013.01); *G11C 16/08* (2013.01); *G11C 16/24* (2013.01); *G11C 2207/2254* (2013.01)

(58) Field of Classification Search
CPC ....... G11C 29/028; G11C 16/08; G11C 16/24; G11C 2207/2254; G11C 29/46; G11C 29/52; G11C 29/20; G11C 2029/0409; G11C 16/30
See application file for complete search history.

(56) References Cited

U.S. PATENT DOCUMENTS

| | | | |
|---|---|---|---|
| 9,607,692 B2 | 3/2017 | Tang et al. | |
| 9,646,709 B2 | 5/2017 | Reusswig et al. | |
| 10,096,370 B1 | 10/2018 | Jean et al. | |
| 10,096,380 B1 | 10/2018 | Luo et al. | |
| 10,121,551 B1 | 11/2018 | Miller et al. | |
| 10,199,111 B1 | 2/2019 | Besinga et al. | |
| 10,347,344 B2 * | 7/2019 | Malshe | G11C 16/349 |
| 10,586,602 B2 * | 3/2020 | Malshe | G11C 16/04 |
| 10,671,914 B2 | 6/2020 | Yakopcic et al. | |
| 10,777,284 B2 * | 9/2020 | Malshe | G11C 29/021 |
| 11,043,278 B2 * | 6/2021 | Malshe | G11C 29/028 |
| 2010/0188904 A1 | 7/2010 | Aritome | |
| 2012/0254699 A1 | 10/2012 | Ruby et al. | |
| 2012/0284574 A1 | 11/2012 | Avila et al. | |
| 2013/0176784 A1 | 7/2013 | Cometti et al. | |
| 2015/0063026 A1 | 3/2015 | Koudele | |
| 2015/0127883 A1 | 5/2015 | Chen et al. | |
| 2016/0117216 A1 | 4/2016 | Muchherla et al. | |
| 2016/0118129 A1 | 4/2016 | Muchherla et al. | |
| 2016/0141048 A1 | 5/2016 | Camp et al. | |
| 2016/0211033 A1 | 7/2016 | Lee | |
| 2017/0031845 A1 | 2/2017 | Tzafrir | |
| 2017/0068479 A1 | 3/2017 | Chin et al. | |
| 2017/0076811 A1 | 3/2017 | Reusswig et al. | |
| 2017/0091039 A1 | 3/2017 | Hong | |
| 2017/0148510 A1 | 5/2017 | Bazarsky et al. | |
| 2018/0277228 A1 | 9/2018 | Takada et al. | |
| 2019/0066802 A1 | 2/2019 | Malshe et al. | |
| 2019/0295660 A1 | 9/2019 | Malshe et al. | |
| 2020/0176063 A1 | 6/2020 | Malshe et al. | |
| 2020/0411117 A1 | 12/2020 | Malshe et al. | |

FOREIGN PATENT DOCUMENTS

| | | |
|---|---|---|
| KR | 20160113051 | 9/2016 |
| KR | 102365950 | 2/2022 |
| TW | 201923772 A | 6/2019 |
| TW | I731256 | 6/2021 |
| WO | WO-2019046326 A1 | 3/2019 |

OTHER PUBLICATIONS

U.S. Appl. No. 15/689,747 U.S. Pat. No. 10,347,344, filed Aug. 29, 2017, Read Voltage Calibration Based on Host IO Operations.
U.S. Appl. No. 16/436,567 U.S. Pat. No. 10,586,602, filed Jun. 10, 2019, Read Voltage Calibration Based on Host IO Operations.
U.S. Appl. No. 16/782,720 U.S. Pat. No. 10,777,284, filed Feb. 5, 2020, Read Voltage Calibration Based on Host IO Operations.
U.S. Appl. No. 17/017,291 U.S. Pat. No. 11,043,278, filed Sep. 10, 2020, Read Voltage Calibration Based on Host IO Operations.
"European Application Serial No. 18852323.7, Extended European Search Report dated Apr. 21, 2021", 9 pgs.
"European Application Serial No. 18852323.7, Response filed Oct. 19, 2020 to Communication pursuant to Rules 161(2) and 162 EPC dated Apr. 9, 2020", 6 pgs.
"International Application Serial No. PCT/US2018/048383, International Search Report dated Dec. 5, 2018", 3 pgs.
"International Application Serial No. PCT/US2018/048383, Written Opinion dated Dec. 5, 2018", 7 pgs.
"Korean Application Serial No. 10-2020-7009015, Notice of Preliminary Rejection dated Feb. 28, 2021", w/ English translation, 11 pgs.
"Korean Application Serial No. 10-2020-7009015, Office Action dated May 4, 2020", w/o English translation, 3 pgs.
"NAND Flash 101: An Introduction to NAND Flash and How to Design It In to Your Next Product", MIcron TN-29-19: NAND Flash 101, (2006), 27 pgs.
"Taiwanese Application Serial No. 107128113, Decision of Rejection dated Jul. 19, 2019", w/English Translation, 14 pgs.
"Taiwanese Application Serial No. 107128113, First Office Action dated Apr. 11, 2019", w/ Concise Statement of Relevance w/ English Translation, 33 pgs.
"Taiwanese Application Serial No. 107128113, Office Action dated Nov. 6, 2020", w/ English Translation, 12 pgs.
"Taiwanese Application Serial No. 107128113, Response filed Jan. 21, 2020 to Decision of Rejection dated Jul. 19, 2019", w/out English claims, 6 pgs.
"Taiwanese Application Serial No. 107128113, Response Filed Jul. 15, 2019 to First Office Action dated Apr. 11, 2019", w/ English Claims, 62 pgs.
Cai, Yu, et al., "Data Retention in MLC NAND Flash Memory: Characterization, Optimization, and Recovery", Carnegie Mellon University, LSI Corporation, 13 pgs.
Cai, Yu, et al., "Threshold Voltage Distribution in MLC NAND Flash Memory:Characterization, Analysis, and Modeling", 1DSSC, Department of Electrical and Computer Engineering, Carnegie Mellon University, Pittsburgh, PA EDDA 978-3-9815370-0-0/DATE13, (2013), 6 pgs.
"Korean Application Serial No. 10-2020-7009015, Response filed Apr. 13, 2021 to Notice of Preliminary Rejection dated Feb. 28, 2021", w/ English Claims, 22 pgs.
"Taiwanese Application Serial No. 107128113, Response filed Feb. 4, 2021 to Office Action dated Nov. 6, 2020", w/ English Claims, 61 pgs.

* cited by examiner

READ VOLTAGE CALIBRATION BASED ON HOST IO OPERATIONS

PRIORITY APPLICATION

This application is a continuation of U.S. application Ser. No. 17/017,291, filed Sep. 10, 2020, which is a continuation of U.S. application Ser. No. 16/782,720, filed Feb. 5, 2020, now issued of U.S. Pat. No. 10,777,284, which is a divisional of U.S. application Ser. No. 16/436,567, filed Jun. 10, 2019, now issued as U.S. Pat. No. 10,586,602, which is a divisional of U.S. application Ser. No. 15/689,747, filed Aug. 29, 2017 and issued as U.S. Pat. No. 10,347,344, each of which is incorporated herein by reference in its entirety.

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data.

However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) may extend adjacent a string of storage cells to form a channel for the storages cells of the string. In the example of a vertical string, the polysilicon structure may be in the form of a vertically extending pillar. In some examples the string may be "folded," and thus arranged relative to a U-shaped pillar. In other examples, multiple vertical structures may be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs may include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

In NAND flash based storage systems, the read voltage threshold ($V_t$) that is required to successfully perform read operations is constantly subjected to shifts. These shifts may occur due to well-known stresses on the NAND flash such as Read Disturb, Data Retention, Cross-temperature effect, among other conditions. Further, different NAND blocks within a memory array may experience a varying amount of stress that induces a varying amount of charge loss or charge gain; likewise, different NAND blocks of an array are often written and read at different temperatures. As a result, a mismatch between the NAND Vt and the read voltage actually used by a storage system may occur in many scenarios. Various techniques for read voltage calibration are used by many NAND storage systems to adjust the read voltage in accordance with NAND Vt. However, existing approaches for launching and utilizing read voltage calibration often fail to fully address the voltage threshold shift that has occurred in a particular area of memory being read, leading to unwanted data errors from read operations, additional calibration and adjustment operations being requested and performed, and delays and reduced performance of the storage system.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The systems, processes, and configurations discussed herein relate to optimization techniques for triggering and performing read voltage calibration of a NAND memory device. Specifically, example techniques are disclosed that utilize the physical footprint of host read 10, in real time, for selecting blocks or other areas of a memory array to be sampled with a voltage level calibration. The calibration of the read voltages may be based on the most frequently read data locations, thus reducing trigger rates and calibrating Vt movement for targeted benchmark stress conditions. Further, example techniques are disclosed that enable intelligent and adaptive block sampling criterion which favors active areas of a memory array (e.g., respective blocks and groups of blocks most frequently accessed by host IO), to calibrate NAND read voltages for best possible read performance in ongoing and future operations. Still further, example techniques are disclosed that identify conditions to trigger the read voltage calibration and that track the state of areas of a memory array involved in host IO operations (including read and erase activity for respective blocks and groups of blocks).

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touchscreen, keyboard, one or more buttons, etc.), a graphics processing unit (GPU), a power management circuit, a baseband processor or one or more transceiver circuits, etc.

Figure 1:
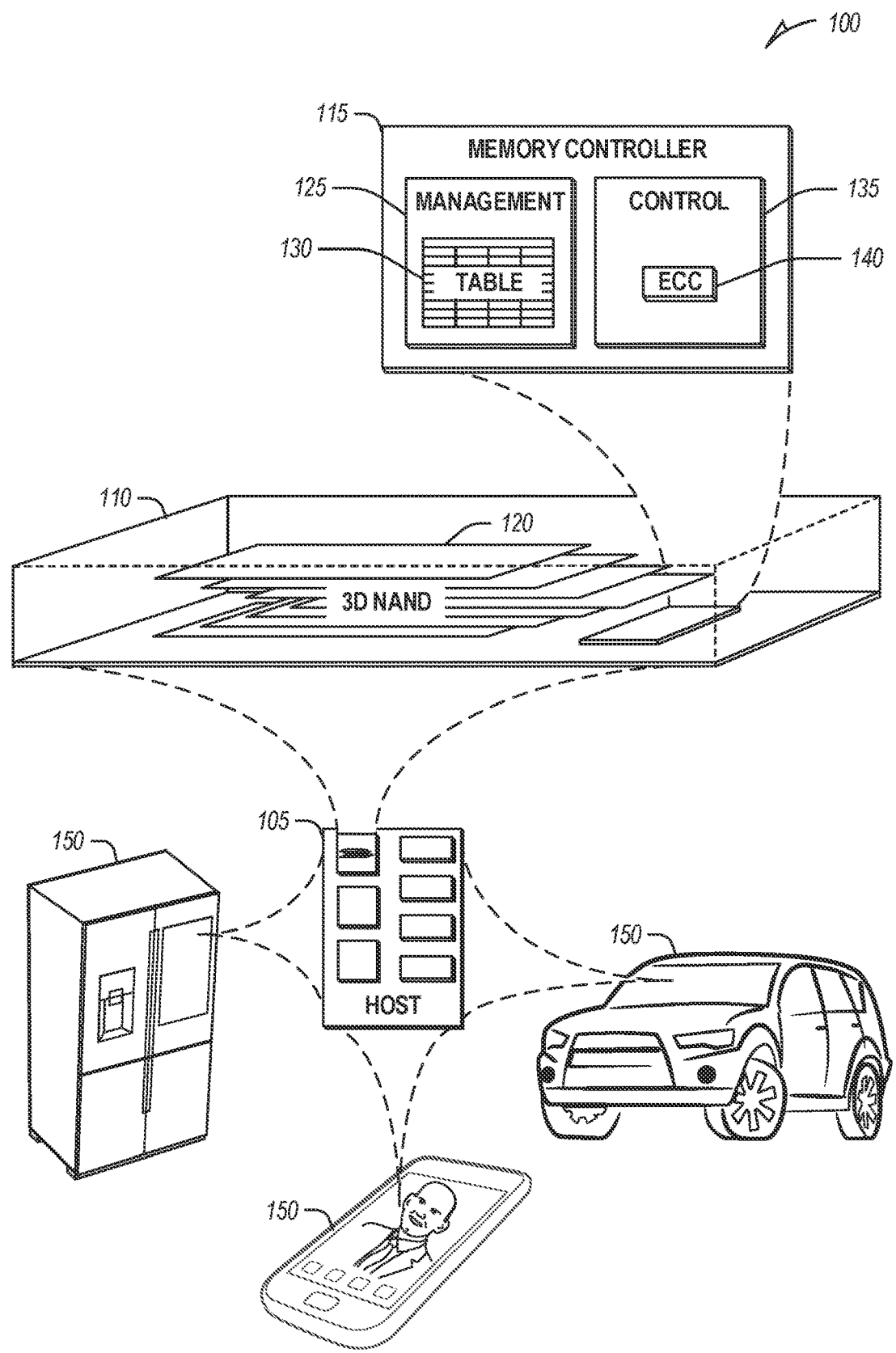
FIG. 1 illustrates an example of an environment including a memory device.

FIG. 1 illustrates an example of an environment 100 including a host device 105 and a memory device 110 configured to communicate over a communication interface. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host 105 may be a machine having some portion, or all, of the components discussed in reference to the machine 800 of FIG. 8.

The memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16.384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 2:
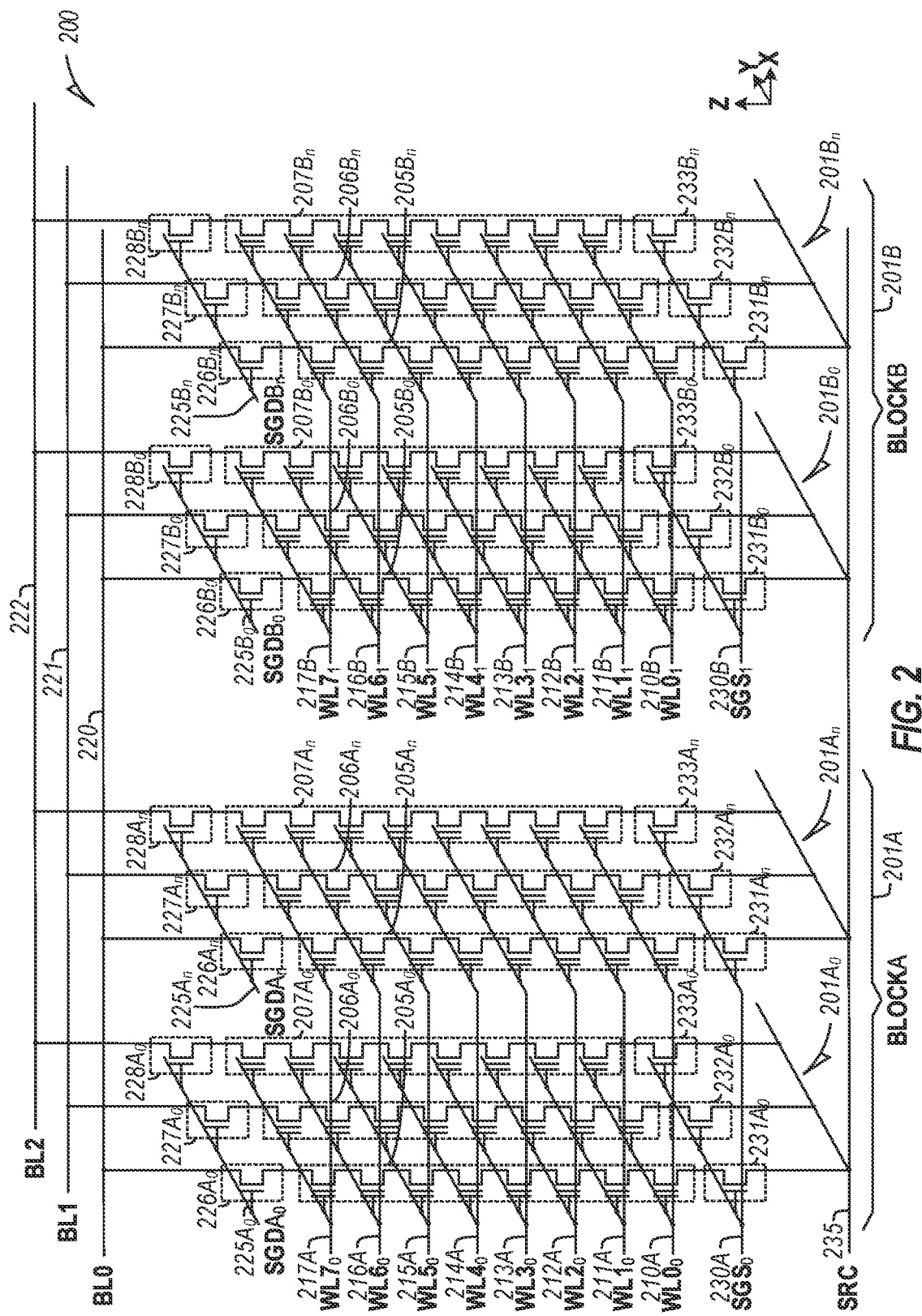
FIGS. 2-3 illustrate schematic diagrams of an example of a 3D NAND architecture semiconductor memory array.

FIG. 2 illustrates an example schematic diagram of a 3D NAND architecture semiconductor memory array 200 including a number of strings of memory cells (e.g., first-third $A_0$ memory strings 205$A_0$-207$A_0$, first-third $A_n$ memory strings 205$A_n$-207$A_n$, first-third $B_0$ memory strings 205$B_0$-207$B_0$, first-third $B_n$ memory strings 205$B_n$-207$B_n$, etc.), organized in blocks (e.g., block A 201A, block B 201B, etc.) and sub-blocks (e.g., sub-block $A_0$ 201$A_0$, sub-block $A_n$ 201$A_n$, sub-block $B_0$ 201$B_0$, sub-block $B_n$ 201$B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS 231$A_0$-233$A_0$, first-third $A_n$ SGS 231$A_n$-233$A_n$, first-third $B_0$ SGS 231$B_0$-233$B_0$, first-third $B_n$ SGS 231$B_n$-233$B_n$, etc.) and a drain-side select gate (SGD) (e.g., first-third $A_0$ SGD 226$A_0$-228$A_0$, first-third $A_n$ SGD 226$A_n$-228$A_n$, first-third $B_0$ SGD 226$B_0$-228$B_0$, first-third $B_n$ SGD 226$B_n$-228$B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL_0$-$WL_7$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD 226$A_0$-228$A_0$ can be accessed using an $A_0$ SGD line SGDA$_0$ 225$A_0$, first-third $A_n$ SGD 226$A_n$-228$A_n$ can be accessed using an $A_n$ SGD line SGDA$_n$ 225$A_n$, first-third $B_0$ SGD 226$B_0$-228$B_0$ can be accessed using an $B_0$ SGD line SGDB$_0$ 225$B_0$, and first-third $B_n$ SGD 226$B_n$-228$B_n$ can be accessed using an B SGD line SGDB$_n$ 225$B_n$. First-third $A_0$ SGS 231$A_0$-233$A_0$ and first-third $A_n$ SGS 231$A_n$-233$A_n$ can be accessed using a gate select line SGS$_0$ 230A, and first-third $B_0$ SGS 231$B_0$-233$B_0$ and first-third $B_n$ SGS 231$B_n$-233$B_n$ can be accessed using a gate select line SGS$_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
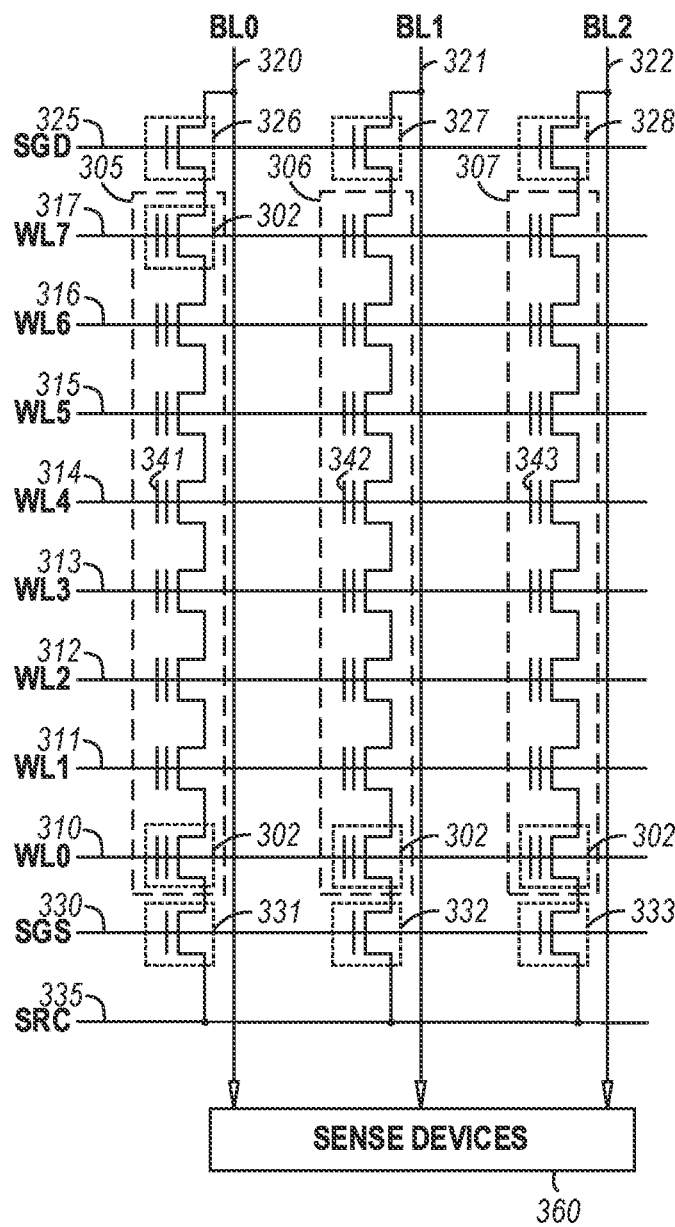

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a suing, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
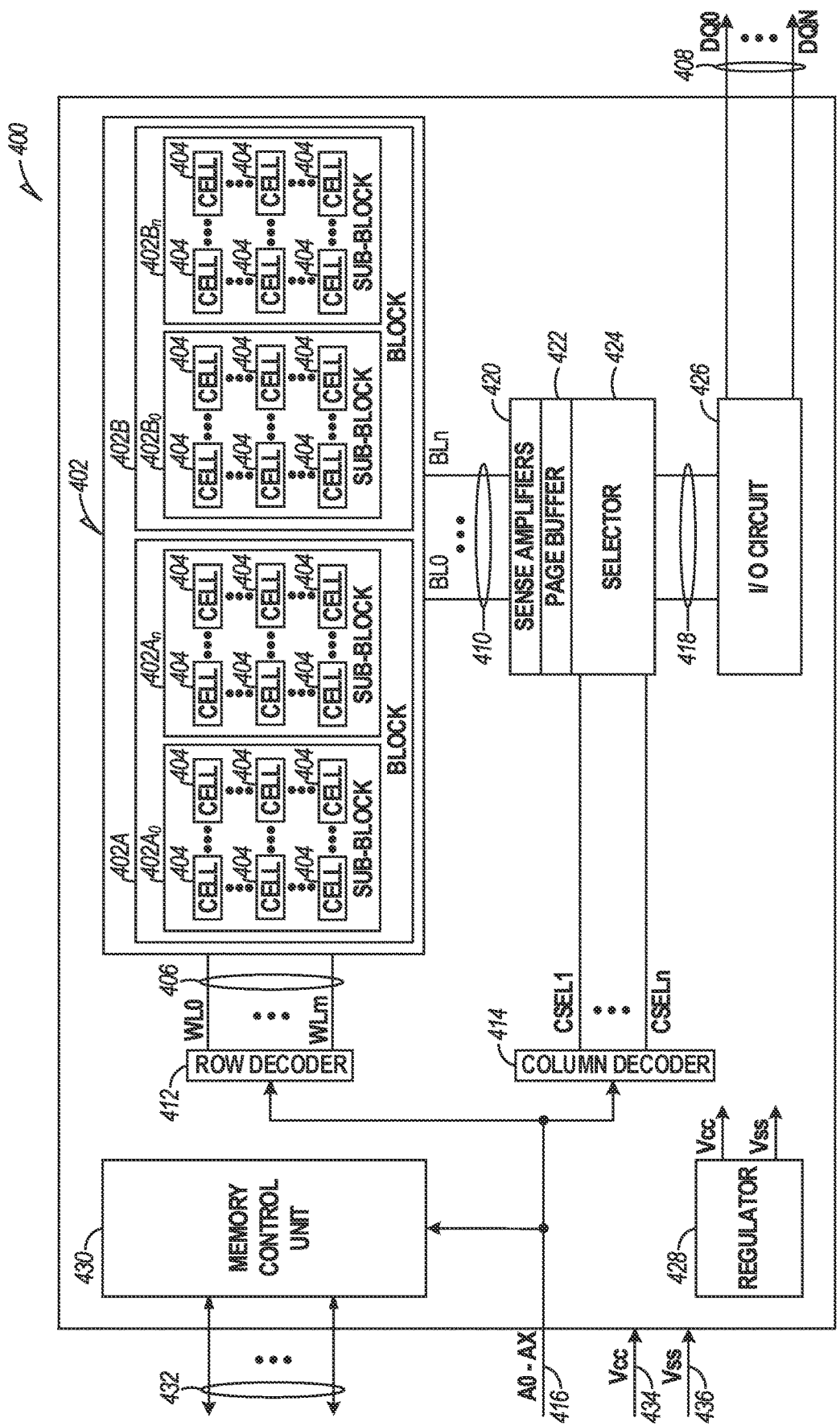
FIG. 4 illustrates an example block diagram of a memory module.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

The following techniques and configurations discussed herein provide techniques implemented within a NAND memory device for aspects of read voltage calibration. The techniques and configurations discussed herein may be specifically applicable to a 3D NAND flash based storage system, such as a system embodying the 3D NAND architecture features discussed above. However, it will be apparent that the disclosed read voltage calibration techniques and configurations may also apply to other forms of NAND flash devices, including with components of NAND flash devices applied in other form factors or arrangements.

In NAND flash based storage systems, a NAND memory array includes various blocks that experience different amount of charge loss and charge gain, and various blocks that are programmed (written) at different temperatures. Thus, the Vt to read any particular block or area of the memory array may vary from another block or another area of the memory array. Further, the Vt for a particular block or area of memory is constantly subjected to shifts due to stresses, and as a result, Vt may shift in either direction.

Read disturb is an example of a stress occurring on a NAND flash device that affects Vt. As a host or application retrieves certain data from the flash device, the read disturb stress may build up if the host utilizes a particularly high read rate or read intensive application of data (depending on how the data is scattered within the flash device). For instance, if a logical block address (LBA) maps to a particular physical location of a NAND block, because of the biasing condition within the block, stresses may be induced on the unselected word lines and memory cells may become biased from one another.

Cross-temperature effect is another example of a stress occurring on a NAND flash device that affects Vt. Cross-temperature effect causes a shift in the cell Vt in the NAND blocks, with positive or negative Vt shifts, as a result of a temperature difference between the time of writing and the time of reading. For instance, as data is written to a NAND flash device (e.g., a SSD drive, or SD/MMC card), the Vt needed to read the data is based on the ambient temperature when the data was written. However, because the data may remain resident on the flash device for long period of time, the flash device is unlikely to be read at the same temperature.

A mismatch between a read voltage used to read a block and the Vt for a particular block will result in data errors. One representation of data errors, the fail bit count, may be measured in a NAND storage system as a "raw bit error rate" (RBER). As a result, RBER provides a function of the mismatch between the read voltage and the Vt. Thus, in the operation of many existing NAND flash-based storage systems, the RBER provides a measurement to determine whether read voltage is incorrect, and whether voltage calibration should be conducted.

The RBER can be minimized by adjusting the read voltage in accordance with Vt, through the use of read voltage calibration. Read voltage calibration may be initiated using a reactive or a proactive method. With a reactive method, read voltage calibration is performed in response to a read error that occurred during the host read 10. The reactive method uses a targeted criteria to calibrate the read voltage directly in response to the read error. In contrast, a proactive method for read voltage calibration uses a sampling approach to periodically track average Vt shifts, and launch calibration before significant errors occur. Existing approaches for proactively performing read level calibration involves sampling of the RBER at different read voltages, and choosing the most optimal read voltage to optimize (e.g., reduce) RBER. For instance, storage device firmware may calibrate NAND read voltage by scanning multiple pages among various locations in a NAND memory array, performing reads at the multiple pages at various read voltages, measuring the resulting RBER, and choosing one of the read voltages with a minimal error rate.

Thus, a primary objective of read voltage calibration is to minimize the error handling trigger rate for the system that will occur during host read 10. With proactive read voltage calibration processes, a variety of blocks of the memory device are sampled to determine average threshold voltage, and to periodically track the average Vt shifts for various blocks of the memory device. The block sampling criteria used in a read voltage calibration (e.g., by sampling a majority of blocks in a flash device) affects the accuracy of a resulting read voltage setting. For instance, many read voltage calibration techniques utilize random sampling of blocks or data age-based sampling, which tends correlate the voltage calibration to the majority state of the flash device. However, the majority state of the flash device does not necessarily correspond to the majority of the blocks accessed by the host read IO at a particular time on the flash device. Thus, existing approaches for majority state-based sampling criteria for proactive read voltage calibration may not be fully effective in reducing an error handling trigger rate and RBER.

A simple explanation of why sampling may not be effective, is because the Vt corresponding to locations of host read 10 may not necessarily align with a voltage setting determined from sampling a majority state of the storage device. For example, consider a scenario where an SSD drive stores archived media files, rarely accessed by the host, which occupy up to 70% of the total drive space. The host, however, accesses other files on remaining 30% of the drive space relatively frequently. In this scenario, calibrating read voltages based on random sampling of blocks would not be optimal, because the resulting calibration would tend to over-compensate for the existence of the archived media files. Thus, calibrating read voltages based on sampling the majority state of the drive may not accurately adjust threshold voltage—and hence may not reduce the error handling triggers—associated with the host IO and the most frequently accessed portion of the host data.

The techniques discussed herein include use of the physical footprint of host read IO in real time for selecting sample blocks for read voltage calibration. In host IO-based sampling, a controller of a memory device tracks the host IO footprint at a page, word line, or physical block level, and uses this tracked information for identifying read voltage calibration block sampling candidates. The controller calibrates the read voltages based on the most frequently read data, thus reducing trigger rates. In an example, this tracking technique may involve tracking read locations and read frequency used in host IO operations for subsequent sampling, and monitoring error rates occurring with such locations. Also in an example, this tracking technique may involve tracking a number of reads or erases to a particular unit of the memory (e.g., a page, a block, a die, etc.).

By using the physical footprint of host IO, a memory device may operate to more effectively detect and calibrate NAND Vt movement for read intensive applications as well as targeted benchmark stress conditions. Further, the memory device may utilize a smarter block sampling criterion to favor blocks or other physical units of memory that are most often accessed by host IO to calibrate NAND read voltages for best possible read performance.

The techniques discussed herein thus improve the error handling trigger rates by aligning NAND Vt shifts with the host read IO footprint at a physical level. The techniques also achieve improved read performance/latency for targeted benchmarks versus existing calibration approaches, with minimal or zero impact on normal user workloads. Additionally, the techniques helps alleviate NAND trigger rate requirements due to targeted benchmark and user workloads, which helps eliminate NAND over-design that might otherwise result in NAND endurance or performance penalty.

Figure 5:
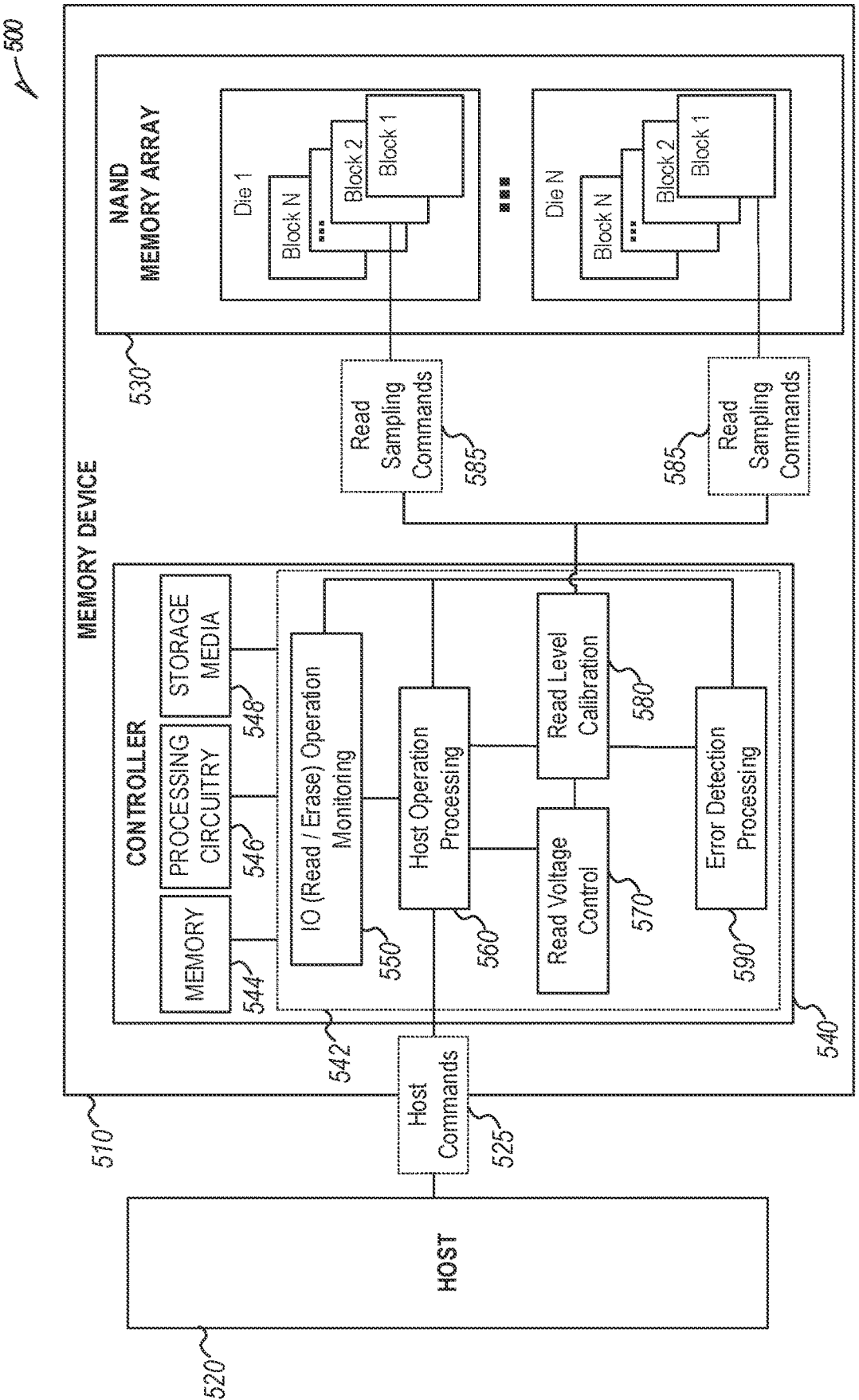
FIG. 5 illustrates a block diagram of an example system including a memory device adapted for implementing an optimized technique for read voltage calibration.

FIG. 5 provides a block diagram of an example system 500 including a memory device 510 (e.g., a SSD storage device, a SD/MMC card, etc.) adapted for implementing the read voltage calibration optimization discussed herein. As shown, the memory device 510 includes a NAND memory array 530 with multiple dies (dies 1-N), with each die including one or more blocks (blocks 1-N). Each of the one or more blocks may include further divided portions, such as one or more pages (not shown) per block; each of the one or more pages may be further divided into one or more word lines (not shown) per page; each of the word lines may be divided into one or more memory cells (not shown).

In an example, the blocks of memory cells of the memory array 530 include groups of at least one of: single-level cell (SLC), multi-layer cell (MLC), triple-layer cell (TLC), or quad-layer cell (QLC) NAND memory cells. Also, in an example, the memory array 530 is arranged into a stack of three-dimensional (3D) NAND dies, such that the respective group of multiple blocks hosting a respective block is a member of a group of blocks provided by a respective die in the stack of 3D NAND dies. These configurations and further detailed components of the memory array 530 are not illustrated in FIG. 5 for simplicity. However, the memory array 530 may incorporate these or any of the features described above with reference to features of 3D NAND architecture devices or other forms of NAND storage devices.

The memory device 510 is shown as being operably coupled to a host 520 via a controller 540. The controller 540 is adapted to receive and process host commands 525, such as read operations, write operations, erase operations, and the like, to read, write, erase, and similar operations within the memory array 530. A variety of other components for the memory device 510 (such as a memory manager, and other circuitry or operational components) and the controller 540 are also not depicted for simplicity.

The controller 540 is depicted as including a memory 544 (e.g., volatile memory), processing circuitry 546 (e.g., a microprocessor), and a storage media 548 (e.g., non-volatile memory), used for executing instructions (e.g., instructions hosted by the storage media 548, loaded into memory 544, and executed by the processing circuitry 546) to perform control operations 542 for management and use of the memory array 530. The control operations 542 performed or facilitated by the controller 540 may be provided from various types of hardware, firmware, and software functionality (e.g., logic implemented in hardware, specially programmed modules, etc.).

The functionality provided by the control operations 542 may include: IO operation monitoring 550 (e.g., to monitor read and erase operations, originating from host commands); host operation processing 560 (e.g., to interpret and process the host commands 525, and to issue further commands to the memory array 530 to perform respective read, write, erase, or other host-initiated operations); read voltage control 570 (e.g., to establish, set, and utilize a read voltage level to read a particular portion of the memory array 530); read level calibration 580 (e.g., to operate a calibration procedure to identify a new read voltage level of a particular portion or portions of the memory array 530); and error detection processing 590 (e.g., to identify and correct errors from data obtained in read operations, to identify one or more RBER(s) for a particular read operation or set of operations, etc.).

In an example, the IO operation monitoring 550 operates to track reads and writes to the memory array, and also to track accompanying read operations and write operations relevant to voltage level and calibration. Further, the IO operation monitoring 550 may identify characteristics of various blocks and block operations within the memory array 530, and identify blocks subjected to frequent read or erase operations (e.g., blocks that are read more frequently than other blocks, or blocks that have been erased more times than other blocks). As further detailed in the examples discussed in FIG. 6 below, this may include the use of counters established for IO operations, established at a page, block, or die level, such as a read counter to measure the number of reads occurring to a respective block or die, or a erase counter to measure the number of erases occurring to a respective block. These counters may be used as triggers for calibration, data inputs to sampling operations performed in calibration, as discussed in the examples of FIG. 6 below.

In an example, the read voltage control 570 is used to establish, change, and provide a voltage value used to read a particular area of memory (such as a respective block in the memory array 530). For example, the read voltage control 570 may implement various positive or negative offsets in order to read respective memory cells and memory locations (e.g., pages, blocks, dies) including the respective memory cells.

In an example, the read level calibration 580 is used to establish (e.g., change, update, reset, etc.) the value of the read voltage implemented by the read voltage control 570. The read level calibration 580 may be implemented through multiple sampling commands 585 performed on the memory array 530, such as sampling commands issued at varying voltages to multiple areas of the memory array, which attempt to determine a read voltage that is optimized to the Vt of those areas. The read level calibration 580 may operate in connection with the features of the host operation processing 560 or the error detection processing 590. For instance, the host operation processing 560 may identify memory locations for sampling based on IO read operations to those locations; also for instance, the error detection processing 590 may trigger the read level calibration 580 in response to particular conditions of errors or an error rate of read data as exceeding a particular threshold.

In an example, the read level calibration 580 is performed on a per-die basis, for all of the memory locations (e.g., blocks, pages, cells) within such a die. In another example, the read level calibration 580 is performed for multiple areas of the memory array (e.g., multiple dies), through one or more calibration operations (e.g., a series of calibration operations). Also in an example, the error detection processing 590 may detect a RBER, an unrecoverable bit error rate (UBER), or other measurements or error conditions for a memory cell, a group of cells, or larger areas of the memory array (e.g., averages or samples from a block, group of blocks, die, group of dies, etc.). Also in an example, the error detection processing 590 may operate to assist the trigger of a calibration operation with the read level calibration 580, or a tracking operation with the IO operation monitoring 550.

In an example, the data determined through the IO operation monitoring 550 is used to change the characteristics of a voltage calibration operation performed by the read level calibration 580. For instance, specific memory locations being tracked from the IO operation monitoring 550 (e.g., tracking blocks being frequently read) may be utilized as sampling locations within the read level calibration 580. Also for instance, conditions determined from reads of the memory locations (e.g., respective blocks being repeatedly read, respective blocks being read with high error rates, respective blocks being repeatedly erased) as tracked by the IO operation monitoring 550 may also provide a trigger, control, or other input to the read level calibration 580.

In a further example, the specific memory locations being tracked from the IO operation monitoring 550 or the conditions of the memory locations being tracked by the IO operation monitoring 550 may be utilized by the error detection processing 590 to determine a likelihood of read voltage deviation from a mis-calibrated memory location. Thus, features of the IO operation monitoring 550, the host operation processing 560, and the error detection processing 590, may jointly operate to trigger a read level calibration operation, and to identify characteristics (such as sampling locations) of the read level calibration operation.

As discussed herein, the read level calibration 580 performs operations based on data patterns and data activity originating from a host IO read operation footprint. This footprint takes advantage of the logical to physical mapping of memory locations from a LBA address, since physical mapping may be spread among contiguous, different, or even random blocks of memory. The technique discussed herein can track read operations not at a LBA address (logical) level, but rather at a memory cell, page, or block (physical) level. Thus, voltage calibration can occur based on read operations to memory locations of a LBA address that span across multiple blocks and dies.

Additionally, the techniques discussed herein may utilize the physical footprint of host IO, from conditional block sampling, to calibrate subsequent and ongoing read operations. This approach may be useful if a customer intends to optimize read voltages for certain benchmarks, user patterns, read access patterns. The techniques discussed herein may provide granular tracking of read voltage levels for respective memory locations and chunks of data among multiple memory locations, thus allowing a calibration technique to focus efforts on relevant areas in a more efficient and targeted fashion.

In addition to the techniques discussed herein, a variety of existing calibration approaches may be integrated and used in connection with the read level calibration 580. For instance, in addition to sampling the specific memory locations involved IO operations, the read level calibration 580 may additionally obtain locations for sampling based on: random sampling of other blocks in the memory array, sampling of other blocks in the memory array based on data age, or sampling of other blocks in the memory array based on raw bit error rate (RBER) corresponding to the other blocks.

Figure 6:
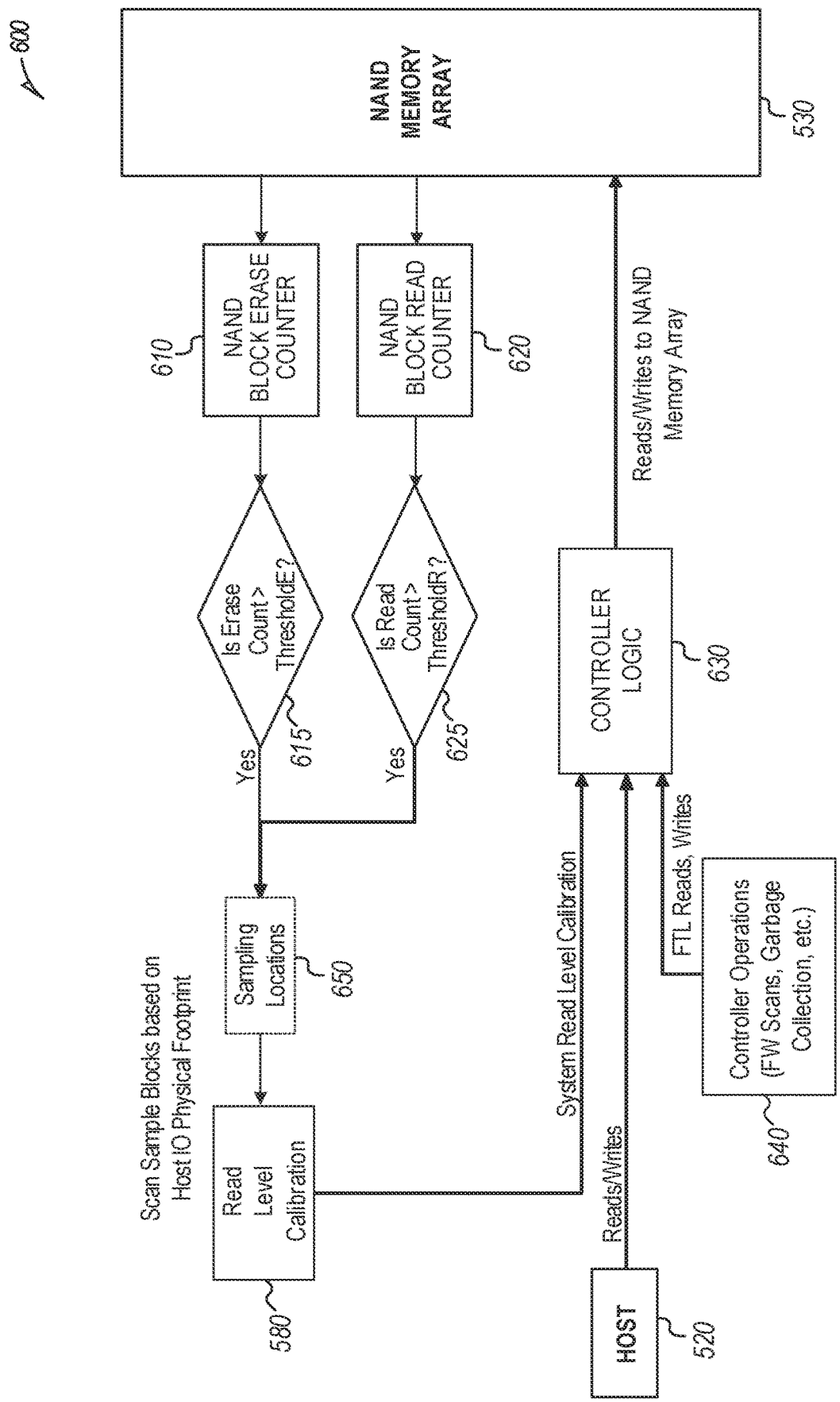
FIG. 6 illustrates an operation sequence diagram of an example memory device configuration adapted for performing an optimized technique for read voltage calibration.

FIG. 6 illustrates an operation sequence diagram 600 of an example memory device configuration adapted for performing an optimized technique for read voltage calibration. As shown, the host 520 is operably coupled to the NAND memory array 530 through the operation of controller logic 630. In an example, the controller logic 630 implements commands for management, control, and access of a subject memory, such as by performing read and write commands to the NAND memory array 530.

As an example, read or write commands received from the host 520 are interpreted by the controller logic 630 to identify memory locations in the memory array for the read or write commands, which then result in respective read and write operations on the identified memory locations of the memory array 530. Likewise, Flash Translation Layer (FTL) read and write commands initiated as part of controller operations 640, such as from FW scans, garbage collection, and the like, also result in respective read and write operations among memory locations of the memory array 530. Further, system read level calibration commands initiated as part of the read level calibration 580, such as with the voltage level calibration techniques discussed herein, result in various read operations among memory locations of the memory array 530. A number of other memory device management operations and commands are not illustrated in the diagram 600 for purposes of simplicity.

In an example, read operations and erase operations (e.g., erase operations implemented via write operations that re-write areas of memory) are tracked in connection with the read level calibration 580. The tracked read operations and erase operations may be utilized by the read level calibration 580 to detect that significant deviation from Vt has occurred, or is likely to occur, with a particular area of memory. For example, a block that has had repeated reads to it may be likely to encounter read disturb stresses. Likewise, a block that has been erased repeatedly is likely to encounter a higher level of wear, and thus experience a higher fail bit count. As a result, the number of reads and the number of erases occurring for a particular block or other area of memory may be tracked and used as a trigger, or as a contributing input or condition, for performing voltage level adjustment operations with the read level calibration 580.

In an example, a NAND erase counter 610 is used to track erase counts for a particular memory location (or additionally, for multiple memory locations) of the memory array 530. For instance, the erase counter 610 may track erase operations at a block level, or at another level in the memory array 530 in which erase operations are implemented. In response to an erase count for a respective block exceeding a determined threshold (ThresholdE) (determination 615), operations may be initiated that perform the read level calibration 580 on the respective block.

Likewise, in an example, a NAND read counter 620 is used to track read counts for a particular memory location (or additionally, for multiple memory locations) of the memory array 530. For instance, the read counter 620 may track read operations at a block level, or at another level in the memory array (e.g., per die) in which read operations are implemented. In a further example, the read level calibration 580 is performed per die, and thus the NAND block read counter 620 is used to aggregate a measurement of reads for all blocks within a respective die. In an example, the read counter 620 and the erase counter 610 are stored in DRAM (e.g., memory 544) of the storage device. In response to a read count for a respective block or die exceeding a determined threshold (ThresholdR) (determination 625), operations may be initiated that perform the read level calibration 580 on the respective block or die.

In an example, the read counter 620 is provided as a weight to the read level calibration 580, to identify whether a particular block or die is likely to experience voltage shift due to read usage (and thus, is more likely to be in need of read voltage calibration). Also in an example, the erase counter 610 is used in combination with the read counter 620 as a secondary metric for the read level calibration 580, to provide an additional weight of whether a particular block is likely to experience voltage shift. However, in other examples, the read counter 620 and the erase counter 610 are used as thresholds for triggers that result in voltage adjustment by the read level calibration 580.

In further examples, the tracking granularity or tracking frequency of read or erase operations in the memory array 530 may be adjusted to reduce the overhead (e.g., processor and memory operations) used for tracking individual blocks or groups of blocks (dies). For instance, individual read operations may be tracked at a die level, rather than at an individual block or a page level; or, every x block in a group of blocks, rather than every block, may be analyzed and tracked; or, every n read operations, rather than each and every read operation, may be analyzed and tracked.

In an example, the read level calibration 580 performs sampling of a threshold voltage of a number of identified locations in the memory array, in order to determine a voltage level for accessing the identified locations (and, as applicable, other locations of the memory array). In this scenario, exceeding the erase threshold (e.g., from determination 615) or exceeding the read threshold (e.g., from determination 625) of a particular memory location might not directly trigger or activate the read level calibration 580; instead, the particular memory location may be added to a set of sampling locations 650 used by the read level calibration 580, with the calibration being triggered or activated from another condition (e.g., a RBER rate exceeding a determined threshold). The tracking of the sampling locations 650 may be implemented with any number of techniques, including those which prioritize certain memory locations based on frequency, error rate, or the like.

In a further example, other locations in the memory array (e.g., locations not identified as exceeding the read threshold (from determination 625) or exceeding the erase threshold (from determination 615)) may be identified and added to the set of sampling locations 650. These may include one or more locations determined based on one or more of: raw bit error rate (RBER) of read operations occurring at a particular location; data age; or random sampling.

In still further examples, the sampling operations that are performed by the read level calibration 580 may allow configuration, such as from a specification (e.g., a determined setting or calculation) of: a size of data (e.g., data corresponding to a page, block, group of blocks, die) that is sampled; a number of pages in total that are sampled; a number of pages within a block that are sampled; whether certain cells, pages, blocks, dies, or certain types of such cells, pages, blocks, dies are or are not sampled; and the like. Likewise, the sampling that is performed by the read level calibration 580 may be adjusted according to certain benchmarks, user patterns, read access patterns, or other characteristics to match the real-world actual or expected usage of the storage device.

Also in a further example, the counters 610, 620 may decay or may reset as a result of managed operations within the controller (e.g., controller operations 640). For example, folding of a particular block will result in garbage collection, consolidation, and erasure of the block, resulting in an increment of the erase counter 610 and a reset of the read counter 620 for a particular block. The reset of the read counter 620, in particular, may occur because the read disturb, data retention, and cross-temperature effects are generally eliminated when a block is erased and a memory cell returns to its native state. Other techniques for emphasizing or de-emphasizing read or erases of particular memory locations involved with host IO may also be utilized with the counters 610, 620, the sampling locations 650, and the read level calibration 580.

Figure 7:
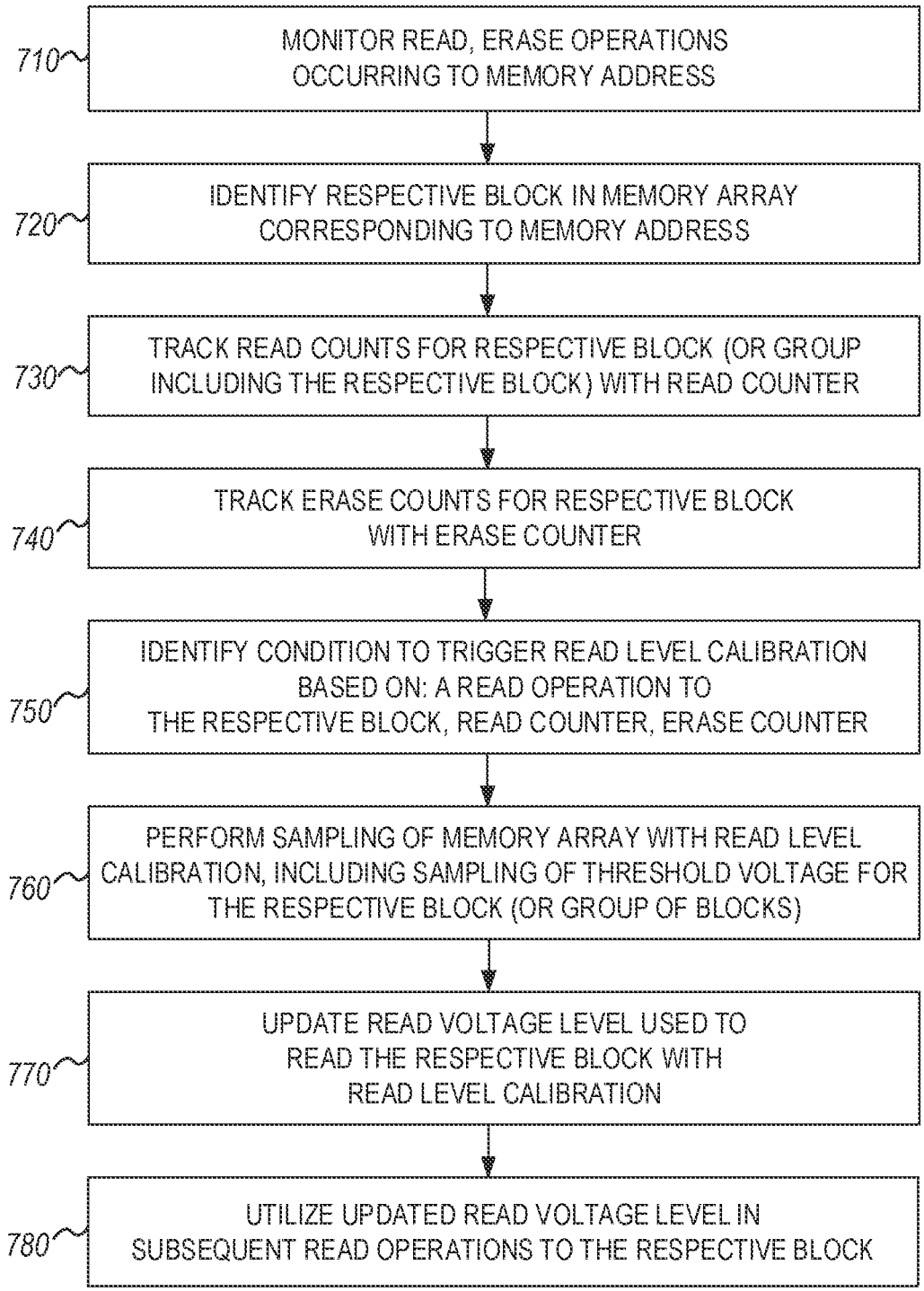
FIG. 7 illustrates a flowchart of an example set of operations adapted for performing an optimized technique for read voltage calibration.

FIG. 7 illustrates a flowchart 700 of an example set of operations adapted for performing an optimized technique for read voltage calibration. In an example, the operations of the flowchart 700 may be implemented by a controller (e.g., controller 115, 540) of a storage device, through a combination of executed operations in software, firmware, or configured hardware. However, some or all aspects of the following techniques may be implemented by other components (e.g., as initiated by a host) in connection with other commands, controls, and forms of orchestration.

In an example, the operations of the flowchart 700 may be implemented in a memory device, the memory device comprising a NAND memory array having groups of multiple blocks of memory cells, and a memory controller operably coupled to the memory array, with the memory controller adapted (e.g., configured, arranged, programmed) to perform the respective operations. In another example, the operations of the flowchart 700 may be implemented in a method performed by or on a memory controller of a NAND memory array, the memory array having groups of multiple blocks of memory cells. In an example, the operations of the flowchart 700 may be implemented in a device readable storage medium, which provides instructions that perform the respective operations when executed (e.g., when executed by a controller of a memory device).

The flowchart 700 is shown as commencing with the monitoring of IO operations, such as read and erase operations occurring to a particular memory address (operation 710). This monitoring is followed by an identification of a particular location in the memory array (e.g., a respective block) that corresponds to the memory address (e.g., LBA) of the read or erase operation (operation 720). For example, the monitoring of the read and erase operations may determine whether a read has occurred to a respective block of the memory array, with this respective block identified based on a block that includes a page corresponding to the identified location (e.g., a location in the memory array that the LBA maps to).

The flowchart 700 continues with the tracking of counts of IO operations occurring to the specific location in memory (e.g., the respective block or a group of blocks). As depicted, the tracking may include the tracking of read counts for a memory location with a read counter (operation 730) and the tracking of erase counts for a memory location with an erase counter (operation 740). These counts may be implemented in a read counter and erase counter, respectively, as indicated above for FIG. 6. For instance, the number of reads to the memory location may be tracked in a first counter maintained in a memory accessible by the memory controller, and the number of erases to the memory location may be tracked in a second counter maintained in the memory accessible by the memory controller. In an example, the tracking of the read counts is tracked at a respective block level, and the tracking of erase counts is tracked at a respective block level. In another example, the tracking of the read counts is tracked at a die level (e.g., for a die including a plurality of blocks). Also in an example, an erase occurring to the memory location (e.g., an erase of the respective block) increments the erase counter while resetting the read counter (e.g., resetting to zero). In further examples, the erase counter is not implemented or utilized, allowing the tracking of the erase counts (in operation 740) to be an optional operation.

The flowchart 700 continues with the identification of a condition to trigger a read level calibration (operation 750). In an example, the condition to trigger the read level calibration may be based on one or more of: a read operation occurring to a respective block, a state of a read counter, or a state of an erase counter. As an example, the condition to trigger the read level calibration may occur as a result of monitoring multiple read operations to a respective block of the memory array. In a further example, the condition is identified based on the number of reads occurring to the respective block exceeding a determined number of reads. Also as an example, the condition to trigger the read level calibration may be identified based on a number of erases to the respective block exceeding a determined number of erases.

In an additional example, the condition to trigger the read level calibration may occur based on the evaluation of groups of multiple blocks rather than a respective block, such as tracking a number of reads occurring to a group of multiple blocks (the group hosting the respective block) to identify the condition when the reads exceed a determined number of reads. Also in an additional example, the condition to trigger the read level calibration may occur based in part on a raw bit error rate (RBER) of read operations occurring to at least the respective block of the memory array.

In response to the identified condition (from operation 750), a read level calibration operation may be performed on the memory device (operation 760). In an example, the read level voltage calibration operations include performing a sampling of various areas of a memory array, to sample for threshold voltage values and determine a read voltage level. In an example, such sampling includes the sampling of a threshold voltage level of the respective block identified from the monitored read operations. In another example, such sampling includes the sampling of a threshold voltage level of a respective group of multiple blocks hosting the respective block.

The read level calibration operation determines one or more values for read voltage that more accurately reflects the threshold voltage(s) for the respective block; in turn, the read voltage level(s) used to read one or more page(s) of the respective block is updated with this value (operation 770). The updated read voltage level(s) then may be utilized in subsequent read operations used to read one or more pages with the respective block (operation 780). In another example, the read voltage level(s) is updated and utilized on the basis of a group of blocks (e.g., for a respective die); in still another example, the read voltage level is tracked, updated, and utilized on the basis of a subset of the respective block (e.g., for a respective page or other set of memory cells within a block).

Based on the techniques discussed above, read voltage may be triggered, identified, and tracked based on the host IO state rather than an overall, imprecise memory array state. Thus, it will be understood that the techniques discussed herein may be optimized to track the pattern of reads occurring at a physical level, increasing the accuracy of any resulting voltage adjustments. Further, the techniques for sampling and triggering the voltage calibration may modified to be integrated with use of existing calibration approaches, providing a minimal or even zero impact as compared with conventional sampling.

Figure 8:
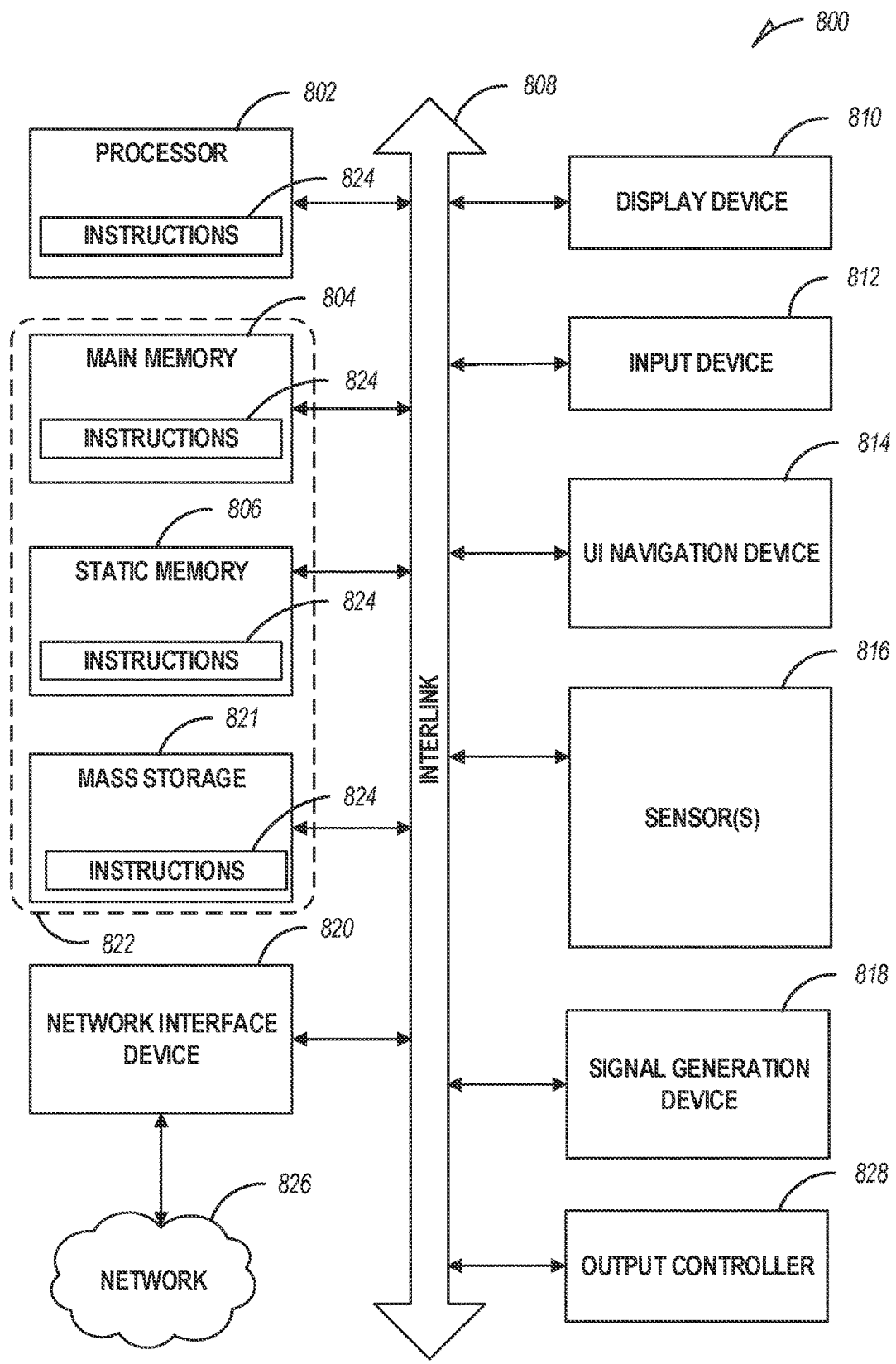
FIG. 8 is a block diagram illustrating an example of a machine upon which one or more embodiments may be implemented.

FIG. 8 illustrates a block diagram of an example machine 800 upon which any one or more of the techniques (e.g., methodologies) discussed herein may perform. In alternative embodiments, the machine 800 may operate as a standalone device or may be connected (e.g., networked) to other machines. In a networked deployment, the machine 800 may operate in the capacity of a server machine, a client machine, or both in server-client network environments. In an example, the machine 800 may act as a peer machine in peer-to-peer (P2P) (or other distributed) network environment. The machine 800 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 800 (e.g., the host device 105, the memory device 110, etc.) may include a hardware processor 802 (e.g., a central processing unit (CPU), a graphics processing unit (GPU), a hardware processor core, or any combination thereof, such as the memory controller 115, etc.), a main memory 804 and a static memory 806, some or all of which may communicate with each other via an interlink (e.g., bus) 808. The machine 800 may further include a display unit 810, an alphanumeric input device 812 (e.g., a keyboard), and a user interface (UI) navigation device 814 (e.g., a mouse). In an example, the display unit 810, input device 812 and UI navigation device 814 may be a touch screen display. The machine 800 may additionally include a storage device (e.g., drive unit) 816, a signal generation device 818 (e.g., a speaker), a network interface device 820, and one or more sensors 816, such as a global positioning system (GPS) sensor, compass, accelerometer, or other sensor. The machine 800 may include an output controller 828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 816 may include a machine readable medium 822 on which is stored one or more sets of data structures or instructions 824 (e.g., software) embodying or utilized by any one or more of the techniques or functions described herein. The instructions 824 may also reside, completely or at least partially, within the main memory 804, within static memory 806, or within the hardware processor 802 during execution thereof by the machine 800. In an example, one or any combination of the hardware processor 802, the main memory 804, the static memory 806, or the storage device 816 may constitute the machine readable medium 822.

While the machine readable medium 822 is illustrated as a single medium, the term "machine readable medium" may include a single medium or multiple media (e.g., a centralized or distributed database, or associated caches and servers) configured to store the one or more instructions 824.

The term "machine readable medium" may include any medium that is capable of storing, encoding, or carrying instructions for execution by the machine 800 and that cause the machine 800 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 824 (e.g., software, programs, an operating system (OS), etc.) or other data are stored on the storage device 821, can be accessed by the memory 804 for use by the processor 802. The memory 804 (e.g., DRAM) is typically fast, but volatile, and thus a different type of storage than the storage device 821 (e.g., an SSD), which is suitable for long-term storage, including while in an "off" condition. The instructions 824 or data in use by a user or the machine 800 are typically loaded in the memory 804 for use by the processor 802. When the memory 804 is full, virtual space from the storage device 821 can be allocated to supplement the memory 804; however, because the storage 821 device is typically slower than the memory 804, and write speeds are typically at least twice as slow as read speeds, use of virtual memory can greatly reduce user experience due to storage device latency (in contrast to the memory 804, e.g., DRAM). Further, use of the storage device 821 for virtual memory can greatly reduce the usable lifespan of the storage device 821.

In contrast to virtual memory, virtual memory compression (e.g., the Linux® kernel feature "ZRAM") uses part of the memory as compressed block storage to avoid paging to the storage device 821. Paging takes place in the compressed block until it is necessary to write such data to the storage device 821. Virtual memory compression increases the usable size of memory 804, while reducing wear on the storage device 821.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 824 may further be transmitted or received over a communications network 826 using a transmission medium via the network interface device 820 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 820 may include one or more physical jacks (e.g., Ethernet, coaxial, or phone jacks) or one or more antennas to connect to the communications network 826. In an example, the network interface device 820 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 800, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a source-side select gate (SOS), a control gate (CG), and a drain-side select gate (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SOS and the CG may form recesses, while the SGD may remain less recessed or even not recessed. These doping configurations may thus enable selective etching into the distinct tiers (e.g., SOS, CG, and SOD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

Additional examples of the presently described embodiments are suggested according to the structures and techniques described above and specified in the following examples and claims.

Example 1 is a memory device, comprising: a NAND memory array having groups of multiple blocks of memory cells; and a memory controller operably coupled to the memory array, the memory controller to perform operations comprising: monitoring read operations occurring to a respective block of the memory array; identifying, based at least in part on the read operations occurring to the respective block, a condition to trigger a read level calibration; and performing, in response to the identified condition, the read level calibration based on a threshold voltage level of a respective group of multiple blocks hosting the respective block, wherein the read level calibration is performed based at least in part on a threshold voltage to read the respective block.

In Example 2, the subject matter of Example 1 includes, monitoring the read operations by tracking a number of reads to the respective block, and wherein the condition to trigger the read level calibration is identified, at least in part, based on the number of reads occurring to the respective block exceeding a determined number of reads.

In Example 3, the subject matter of Example 2 includes, the operations of the memory controller further comprising monitoring erase operations occurring to the respective block, wherein the condition to trigger the read level calibration is further identified based on a number of erases to the respective block exceeding a determined number of erases.

In Example 4, the subject matter of Example 3 includes, the number of reads to the respective block being tracked in a first counter maintained in a memory accessible by the memory controller, wherein the number of erases to the respective block is tracked in a second counter maintained in the memory accessible by the memory controller, and wherein an erase occurring to the respective block resets the first counter.

In Example 5, the subject matter of Examples 1-4 includes, monitoring the read operations by tracking a number of reads to the respective group of multiple blocks hosting the respective block, wherein the condition to trigger the read level calibration is identified, at least in part, based on the number of reads occurring to the respective group of multiple blocks exceeding a determined number of reads.

In Example 6, the subject matter of Examples 1-5 includes, the condition to trigger the read level calibration being further based in part on a raw bit error rate (RBER) of read operations occurring to at least the respective block of the memory array.

In Example 7, the subject matter of Examples 1-6 includes, performing the read level calibration by performing a sampling of the threshold voltage to read the respective block in addition to threshold voltages to read other blocks located among the groups of multiple blocks in the memory array.

In Example 8, the subject matter of Example 7 includes, the other blocks in the memory array included in the sampling being identified within the memory array based on a number of read operations performed among respective blocks of the other blocks.

In Example 9, the subject matter of Examples 7-8 includes, the other blocks in the memory array included in the sampling being identified within the memory array based on at least one of: random sampling of the other blocks in the memory array, sampling of the other blocks in the memory array based on data age, or sampling of the other blocks in the memory array based on raw bit error rate (RBER) corresponding to the other blocks.

In Example 10, the subject matter of Examples 1-9 includes, the read operations to the respective block being monitored by monitoring read operations to one or more portions of the respective block.

In Example 11, the subject matter of Example 10 includes, the monitored portions of the respective block including pages of the respective block.

In Example 12, the subject matter of Examples 1-11 includes, wherein the memory device is operably coupled to a host, wherein the host initiates commands to perform respective reads among the multiple blocks in the memory array, and wherein the respective reads include multiple reads occurring to a logical block address corresponding to a page located within the respective block.

In Example 13, the subject matter of Examples 1-12 includes, the read level calibration updating one or more read voltage levels used to read one or more pages of the respective block in subsequent read operations occurring to the one or more pages of the respective block.

In Example 14, the subject matter of Examples 1-13 includes, the blocks of memory cells of the memory array including at least one of: single-level cell (SLC), multi-layer cell (MLC), triple-layer cell (TLC), or quad-layer cell (QLC) NAND memory cells.

In Example 15, the subject matter of Examples 1-14 includes, the memory array being arranged into a stack of three-dimensional (3D) NAND dies, wherein the respective group of multiple blocks hosting the respective block corresponds to a group of blocks provided by a respective die in the stack of 3D NAND dies.

Example 16 is a method for optimizing voltage read level calibration in a memory device, the method comprising a plurality of operations performed by a memory controller of a NAND memory array, and the memory array having groups of multiple blocks of memory cells, with the operations comprising: monitoring read commands issued to a respective block of the memory array; identifying, based at least in part on the read commands issued to the respective block, a condition to trigger a read level calibration; and performing, in response to the identified condition, the read level calibration based on a threshold voltage level of a respective group of multiple blocks hosting the respective block, wherein the read level calibration is performed based at least in part on a threshold voltage to read the respective block; wherein the read level calibration updates a read voltage level used to read a page of the respective block in subsequent read operations to the page of the respective block.

In Example 17, the subject matter of Example 16 includes, monitoring the read operations by tracking a number of reads to the respective block, and wherein the condition to trigger the read level calibration is identified, at least in part, based on the number of reads occurring to the respective block exceeding a determined number of reads.

In Example 18, the subject matter of Example 17 includes, monitoring erase operations occurring to the respective block, wherein the condition to trigger the read level calibration is further identified based on a number of erases to the respective block exceeding a determined number of erases.

In Example 19, the subject matter of Example 18 includes, the number of reads to the respective block being tracked in a first counter maintained in a memory accessible by the memory controller, wherein the number of erases to the respective block is tracked in a second counter maintained in the memory accessible by the memory controller, and wherein an erase occurring to the respective block resets the first counter.

In Example 20, the subject matter of Examples 16-19 includes, monitoring the read operations by tracking a number of reads to the respective group of multiple blocks hosting the respective block, and wherein the condition to trigger the read level calibration is identified, at least in part, based on the number of reads occurring to the respective group of multiple blocks exceeding a determined number of reads.

In Example 21, the subject matter of Examples 16-20 includes, the condition to trigger the read level calibration being further based in part on a raw bit error rate (RBER) of read operations occurring to at least the respective block of the memory array.

In Example 22, the subject matter of Examples 16-21 includes, performing the read level calibration by performing a sampling of the threshold voltage to read the respective block in addition to threshold voltages to read other blocks located among the groups of multiple blocks in the memory array.

In Example 23, the subject matter of Example 22 includes, the other blocks in the memory array included in the sampling being identified within the memory array based on a number of read operations performed among respective blocks of the other blocks.

In Example 24, the subject matter of Examples 22-23 includes, the other blocks in the memory array included in the sampling being identified within the memory array based on at least one of: random sampling of the other blocks in the memory array, sampling of the other blocks in the memory array based on data age, or sampling of the other blocks in the memory array based on raw bit error rate (RBER) corresponding to the other blocks.

In Example 25, the subject matter of Examples 16-24 includes, the read operations to the respective block being monitored by monitoring read operations to one or more portions of the respective block.

In Example 26, the subject matter of Example 25 includes, the monitored portions of the respective block including pages of the respective block.

In Example 27, the subject matter of Examples 16-26 includes, the memory device being operably coupled to a host, wherein the host initiates commands to perform respective reads among the multiple blocks in the memory array, and wherein the respective reads include multiple reads occurring to a logical block address corresponding to a page located within the respective block.

In Example 28, the subject matter of Examples 16-27 includes, the read level calibration updating one or more read voltage levels used to read one or more pages of the respective block in subsequent read operations occurring to the one or more pages of the respective block.

In Example 29, the subject matter of Examples 16-28 includes, the blocks of memory cells of the memory array including at least one of: single-level cell (SLC), multi-layer cell (MLC), triple-layer cell (TLC), or quad-layer cell (QLC) NAND memory cells.

In Example 30, the subject matter of Examples 16-29 includes, the memory array being arranged into a stack of three-dimensional (3D) NAND dies, wherein the respective group of multiple blocks hosting the respective block corresponds to a group of blocks provided by a respective die in the stack of 3D NAND dies.

Example 31 is a device readable storage medium, that provides instructions that, when executed by a controller of a memory device, optimizes voltage read level calibration in the memory device, wherein the instructions cause the controller to perform operations according to any of the techniques of Examples 1-30.

Example 32 is an apparatus comprising respective means for performing any of the methods or techniques of Examples 1-30.

Example 33 is a system, apparatus, or device to perform the operations of any of Examples 1-30.

Example 34 is a tangible machine readable medium embodying instructions to perform or implement the operations of any of Examples 1-30.

Example 35 is a method to perform the operations of any of Examples 1-30.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A memory device, comprising:
a memory array comprising a group of multiple blocks of memory cells; and
a controller operably coupled to the memory array, the controller configured to perform operations comprising:
identifying, based at least in part on read operations to a block of the group, a condition to trigger a read level calibration; and
performing, in response to the identified condition, the read level calibration, the read level calibration comprising a sampling operation that evaluates a threshold voltage level of the group.

2. The memory device of claim 1, wherein the operations further comprise:
monitoring the read operations to the block.

3. The memory device of claim 2, wherein the monitoring of the read operations includes tracking a number of reads to the block.

4. The memory device of claim 3, wherein the condition to trigger the read level calibration is identified, at least in part, based on the number of reads to the block and a predetermined number of reads.

5. The memory device of claim 2, wherein the monitoring of the read operations to the block comprises monitoring read operations to the group comprising the block.

6. The memory device of claim 1, wherein:
the operations further comprise monitoring erase operations to the block; and
the condition to trigger the read level calibration is identified, at least in part, based on a number of erases to the block and a predetermined number of erases.

7. The memory device of claim 6, wherein the operations further comprise:
tracking a number of reads to the block; and
resetting the number of reads to the block in response to an erase of the block.

8. The memory device of claim 1, wherein:
the memory array comprises a second group of multiple blocks of memory cells, the second group comprising a second block; and
the performing of the read level calibration includes:
sampling the threshold voltage to read the block; and
sampling a second threshold voltage to read the second block.

9. The memory device of claim 8, wherein the second block is identified within the memory array based on a number of read operations to the second block.

10. The memory device of claim 8, wherein the second block is identified within the memory array based on random sampling of the blocks of the memory array.

11. The memory device of claim 8, wherein the second block is identified within the memory array based on data age of the blocks of the memory array.

12. The memory device of claim 8, wherein the second block is identified within the memory array based on raw bit error rate (RBER) of the blocks of the memory array.

13. The memory device of claim 1, wherein the condition to trigger the read level calibration is further based on a raw bit error rate (RBER) of read operations to the block.

14. A method comprising:
identifying, based at least in part on read operations to a block of a group of multiple blocks of memory cells in a memory array, a condition to trigger a read level calibration; and
performing, in response to the identified condition, the read level calibration, the read level calibration comprising a sampling operation that evaluates a threshold voltage level of the group.

15. The method of claim 14, further comprising:
monitoring the read operations to the block.

16. The method of claim 15, wherein the monitoring of the read operations includes tracking a number of reads to the block.

17. The method of claim 16, wherein the condition to trigger the read level calibration is identified, at least in part, based on the number of reads to the block and a predetermined number of reads.

18. The method of claim 15, wherein the monitoring of the read operations to the block comprises monitoring read operations to the group comprising the block.

19. The method of claim 14, further comprising:
monitoring erase operations to the block; and wherein
the condition to trigger the read level calibration is identified, at least in part, based on a number of erases to the block and a predetermined number of erases.

20. A device readable storage medium that stores instructions that, when executed by a controller of a memory device, cause the controller to perform operations comprising:
identifying, based at least in part on read operations to a block of a group of multiple blocks of memory cells in a memory array, a condition to trigger a read level calibration; and
performing, in response to the identified condition, the read level calibration, the read level calibration comprising a sampling operation that evaluates a threshold voltage level of the group.

21. The device readable storage medium of claim 20, wherein:
the operations further comprise monitoring erase operations to the block; and
the condition to trigger the read level calibration is identified, at least in part, based on a number of erases to the block and a predetermined number of erases.

22. The device readable storage medium of claim 20, wherein the operations further comprise:
tracking a number of reads to the block; and
resetting the number of reads to the block in response to an erase of the block.

23. The device readable storage medium of claim 20, wherein:
the memory array comprises a second group of multiple blocks of memory cells, the second group comprising a second block; and
the performing of the read level calibration includes:
sampling the threshold voltage to read the block; and
sampling a second threshold voltage to read the second block.

24. The device readable storage medium of claim 23, wherein the second block is identified within the memory array based on a number of read operations to the second block.

* * * * *